(12) United States Patent
Lee

(10) Patent No.: US 12,033,977 B2
(45) Date of Patent: Jul. 9, 2024

(54) SEMICONDUCTOR PACKAGE AND METHOD FOR FABRICATING THE SAME

(71) Applicant: SAMSUNG ELECTRONICS CO., LTD., Suwon-si (KR)

(72) Inventor: Seong Gwan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/189,647

(22) Filed: Mar. 24, 2023

(65) Prior Publication Data
US 2023/0230956 A1     Jul. 20, 2023

Related U.S. Application Data

(63) Continuation of application No. 17/036,465, filed on Sep. 29, 2020, now Pat. No. 11,637,085.

(30) Foreign Application Priority Data

Jan. 30, 2020  (KR) .................. 10-2020-0011060

(51) Int. Cl.
   *H01L 23/48*      (2006.01)
   *H01L 25/00*      (2006.01)
   (Continued)

(52) U.S. Cl.
   CPC .......... *H01L 25/0652* (2013.01); *H01L 25/18* (2013.01); *H01L 25/50* (2013.01);
   (Continued)

(58) Field of Classification Search
   CPC ......... H01L 2225/06506–06562; H01L 25/50; H01L 25/18
   See application file for complete search history.

(56) References Cited

U.S. PATENT DOCUMENTS 7,464,225 B2   12/2008   Tsern
8,643,175 B2   2/2014    Kim et al.
(Continued)

FOREIGN PATENT DOCUMENTS

KR     10-089718    3/2008

OTHER PUBLICATIONS

Office Action dated Aug. 18, 2022 in corresponding U.S. Patent Appln. U.S. Appl. No. 17/036,465.
(Continued)

*Primary Examiner* — Hoa B Trinh
(74) *Attorney, Agent, or Firm* — F. Chau & Associates, LLC

(57) ABSTRACT

A semiconductor package is provided. The semiconductor package includes: a substrate; a first buffer chip and a second buffer chip located on an upper part of the substrate; a plurality of nonvolatile memory chips located on the upper part of the substrate and including a first nonvolatile memory chip and a second nonvolatile memory chip, the first nonvolatile memory chip being electrically connected to the first buffer chip, and the second nonvolatile memory chip being electrically connected to the second buffer chip; a plurality of external connection terminals connected to a lower part of the substrate; and a rewiring pattern located inside the substrate. The rewiring pattern is configured to diverge an external electric signal received through one of the plurality of external connection terminals into first and second signals, transmit the first signal to the first buffer chip, and transmit the second signal to the second buffer chip.

20 Claims, 14 Drawing Sheets

(51) Int. Cl.
*H01L 25/065* (2023.01)
*H01L 25/18* (2023.01)

(52) U.S. Cl.
CPC ............... *H01L 2225/06506* (2013.01); *H01L 2225/06527* (2013.01); *H01L 2225/06562* (2013.01)

(56) References Cited

U.S. PATENT DOCUMENTS

| | | |
|---|---|---|
| 9,087,846 B2 | 7/2015 | Fai et al. |
| 9,263,105 B2 | 2/2016 | Jeon et al. |
| 9,437,586 B2 | 9/2016 | Hong |
| 9,502,345 B2 | 11/2016 | Youn et al. |
| 2012/0079176 A1* | 3/2012 | Sun .................... H01L 25/0657 257/777 |
| 2013/0021760 A1* | 1/2013 | Kim ........................ H01L 24/92 257/773 |
| 2017/0206131 A1* | 7/2017 | Christensen ............ G06F 3/064 |
| 2018/0011633 A1 | 1/2018 | Park |
| 2018/0026022 A1 | 1/2018 | Lee et al. |
| 2021/0242171 A1 | 8/2021 | Lee |

OTHER PUBLICATIONS

List of references on Oct. 18, 2022 in corresponding U.S. Appl. No. 17/036,465.

* cited by examiner

SEMICONDUCTOR PACKAGE AND METHOD FOR FABRICATING THE SAME

CROSS-REFERENCE TO RELATED APPLICATION

This U.S. non-provisional patent application is a continuation of U.S. patent application Ser. No. 17/036,465 filed Sep. 29, 2020, which claims priority under 35 U.S.C. § 119 to Korean Patent Application No. 10-2020-0011060, filed on Jan. 30, 2020, the disclosure of which is incorporated by reference in its entirety herein.

1. TECHNICAL FIELD

The present invention relates to a semiconductor device and a method for fabricating the same.

2. Description of Related Art

A hard disk drive (HDD) including a magnetic disk has been traditionally used as a data storage device of electronic systems such as computer systems. With the development of semiconductor technologies and portable devices, hard disk drives have been gradually replaced with a solid state drive (SSD) device including a nonvolatile memory such as a flash memory (e.g., a NAND-type flash memory).

A solid state drive device generates less heat and noise as compared to a hard disk drive. Further, a solid state drive device may have a faster access rate, a higher degree of integration, and more stability against external shock as compared to a hard disk drive. Further, a data transfer rate of the solid state drive device may be faster than that of the hard disk drive.

A solid state drive device may include a plurality of nonvolatile memory chips and a plurality of channels, where each channel is connected to one or more of the nonvolatile memory chips. As the storage capacity of the solid state drive device increases, the number of the plurality of nonvolatile memory chips connected to each of the plurality of channels increases. However, when many nonvolatile chips are connected to a same channel, some of the nonvolatile chips may be connected to a memory controller at distances that increase latency and decrease product density.

SUMMARY

At least one exemplary embodiment of the present inventive concept provides a semiconductor package in which a point on which an external signal (e.g., a control signal) is diverged is formed inside a substrate on which a nonvolatile memory chip for receiving the diverged signal is placed.

At least one exemplary embodiment of the present inventive concept also provides a method for fabricating a semiconductor package in which a point on which an external signal (e.g., a control signal) is diverged is formed inside a substrate on which a nonvolatile memory chip for receiving the diverged signal is placed.

According to an exemplary embodiment of the present inventive concept, there is provided a semiconductor package including: a substrate; a first buffer chip and a second buffer chip located on an upper part of the substrate; a plurality of nonvolatile memory chips located on the upper part of the substrate and including a first nonvolatile memory chip and a second nonvolatile memory chip, the first nonvolatile memory chip being electrically connected to the first buffer chip, and the second nonvolatile memory chip being electrically connected to the second buffer chip; a plurality of external connection terminals connected to a lower part of the substrate; and a rewiring pattern located inside the substrate. The rewiring pattern is configured to diverge an external electric signal received through one of the plurality of external connection terminals into first and second signals, transmit the first signal to the first buffer chip, and transmit the second signal to the second buffer chip.

According to an exemplary embodiment of the present inventive concept, there is provided a semiconductor package including: a controller which transmits a control signal including a first channel signal and a second channel signal; and a first nonvolatile memory package which receives the first channel signal, and a second nonvolatile memory package which receives the second channel signal, wherein the first nonvolatile memory package and the second nonvolatile memory package are located on a single substrate, and the first channel signal and the second channel signal are diverged from the control signal in the substrate.

According to an exemplary embodiment of the present inventive concept, there is provided a semiconductor package including: a substrate; a first buffer pad and a second buffer pad located on an upper part of the substrate; a first buffer chip and a second buffer chip electrically connected to each of the first buffer pad and the second buffer pad; a plurality of nonvolatile memory chips located on the upper part of the substrate and including a first nonvolatile memory chip and a second nonvolatile memory chip, the first nonvolatile memory chip being electrically connect to the first buffer chip, and the second nonvolatile memory chip being electrically connected to the second buffer chip; a plurality of external connection terminals connected to a lower part of the substrate; a controller which transmits a control signal including a first channel signal and a second channel signal to one of the plurality of external connection terminals; and a rewiring which is located inside the substrate, diverges the control signal into the first and second channel signals, transmits the first channel signal to the first buffer chip, and transmits the second channel signal to the second buffer chip.

BRIEF DESCRIPTION OF THE DRAWINGS

The present inventive concept will become more apparent by describing in detail exemplary embodiments thereof with reference to the attached drawings, in which.

DETAILED DESCRIPTION OF THE EXEMPLARY EMBODIMENTS

Figure 1:
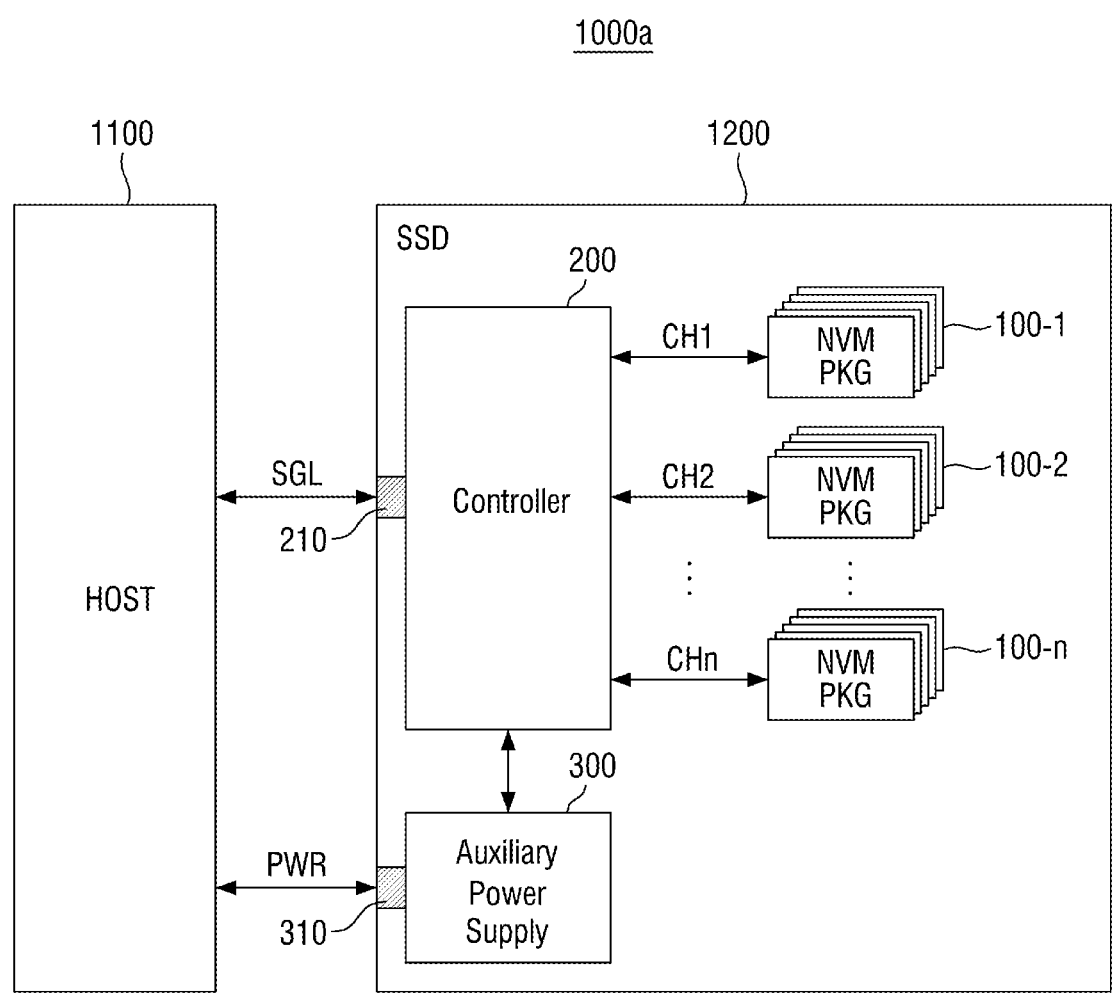
FIG. 1 is an exemplary block diagram showing a storage system including a semiconductor package according to an exemplary embodiment of the inventive concept.

FIG. 1 is an exemplary block diagram showing a storage system including a semiconductor package according to an exemplary embodiment of the inventive concept.

Referring to FIG. 1, a storage system 1000a includes a host 1100 (e.g., a host device) and a storage device 1200.

The storage device 1200 includes a plurality of nonvolatile memory packages 100-1, 100-2 to 100-n and a controller 200 (e.g., a control circuit) according to some embodiments. The plurality of nonvolatile memory packages 100-1, 100-2 to 100-n may be used as storage media of the storage device 1200. Each of the plurality of nonvolatile memory packages 100-1, 100-2 to 100-n may include a plurality of nonvolatile memory chips. In an exemplary embodiment, each of the plurality of nonvolatile memory chips includes a flash memory device.

The controller 200 may be connected to each of the plurality of nonvolatile memory packages 100-1, 100-2 to 100-n through a plurality of channels CH1 to CHn. For example, the first nonvolatile memory package 101-1 may be connected to the controller 200 through a first channel CH1. The first nonvolatile memory package 101-1 may include a plurality of sub-nonvolatile memory packages. Each sub-nonvolatile memory package may include a plurality of nonvolatile memory chips. This will be described in detail through FIG. 4.

The controller 200 may transmit and receive signals SGL to and from the host 1100 through a signal connector 210. In some embodiments, the signals SGL may include commands, addresses, and data. The controller 200 may write data to the plurality of nonvolatile memory packages 100-1, 100-2 to 100-n or may read data from the plurality of nonvolatile memory packages 100-1, 100-2 to 100-n, depending on the commands of the host 1100.

The storage device 1200 according to some embodiments may further include an auxiliary power supply 300. The auxiliary power supply 300 may receive input of power PWR from the host 1100 through a power connector 310 and supply the power to the controller 200.

In the storage device 1200 according to some embodiments, the auxiliary power supply 300 may be located inside the storage device 1200 or may be located outside the storage device 1200. For example, the auxiliary power supply 300 may be located on a motherboard and provide auxiliary power to the storage device 1200. The auxiliary power supply 300 may receive the state of the storage device 1200 from the controller 200 and transfer the power.

The plurality of nonvolatile memory packages 100-1, 100-2 to 100-n and the controller 200 according to some embodiments may be placed on ae same printed circuit board (PCB). In an exemplary embodiment, the plurality of nonvolatile memory packages 100-1, 100-2 to 100-n and the controller 200 are connected to each other through wirings formed on the printed circuit board.

Figure 2:
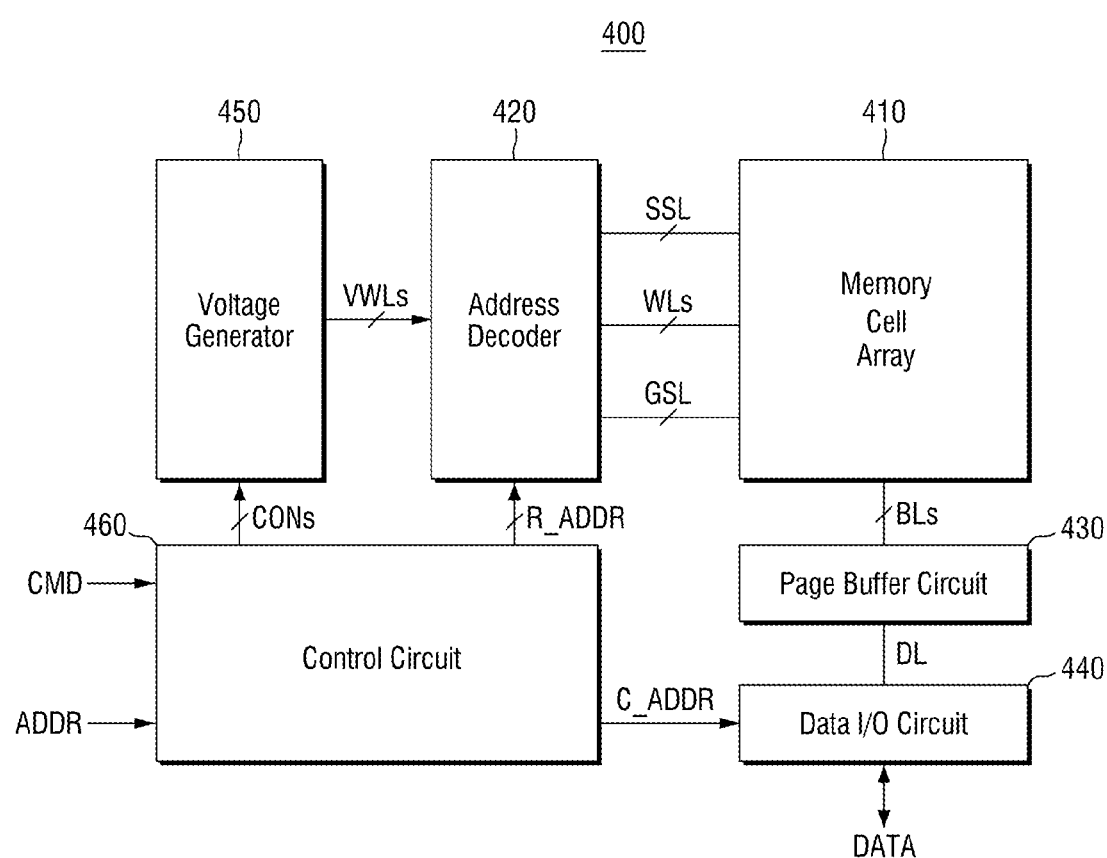
FIG. 2 is an exemplary block diagram showing a storage device including a semiconductor package according to an exemplary embodiment of the inventive concept.

FIG. 2 is an exemplary block diagram showing a storage device including a semiconductor package according to an exemplary embodiment of the inventive concept.

Referring to FIG. 2, a storage device 400 according to an exemplary embodiment of the inventive concept includes a memory cell array 410, an address decoder 420 (e.g., a decoder circuit), a page buffer circuit 430, a data input/output (I/O) circuit 440, a voltage generator 450 and a control circuit 460.

Figure 3:
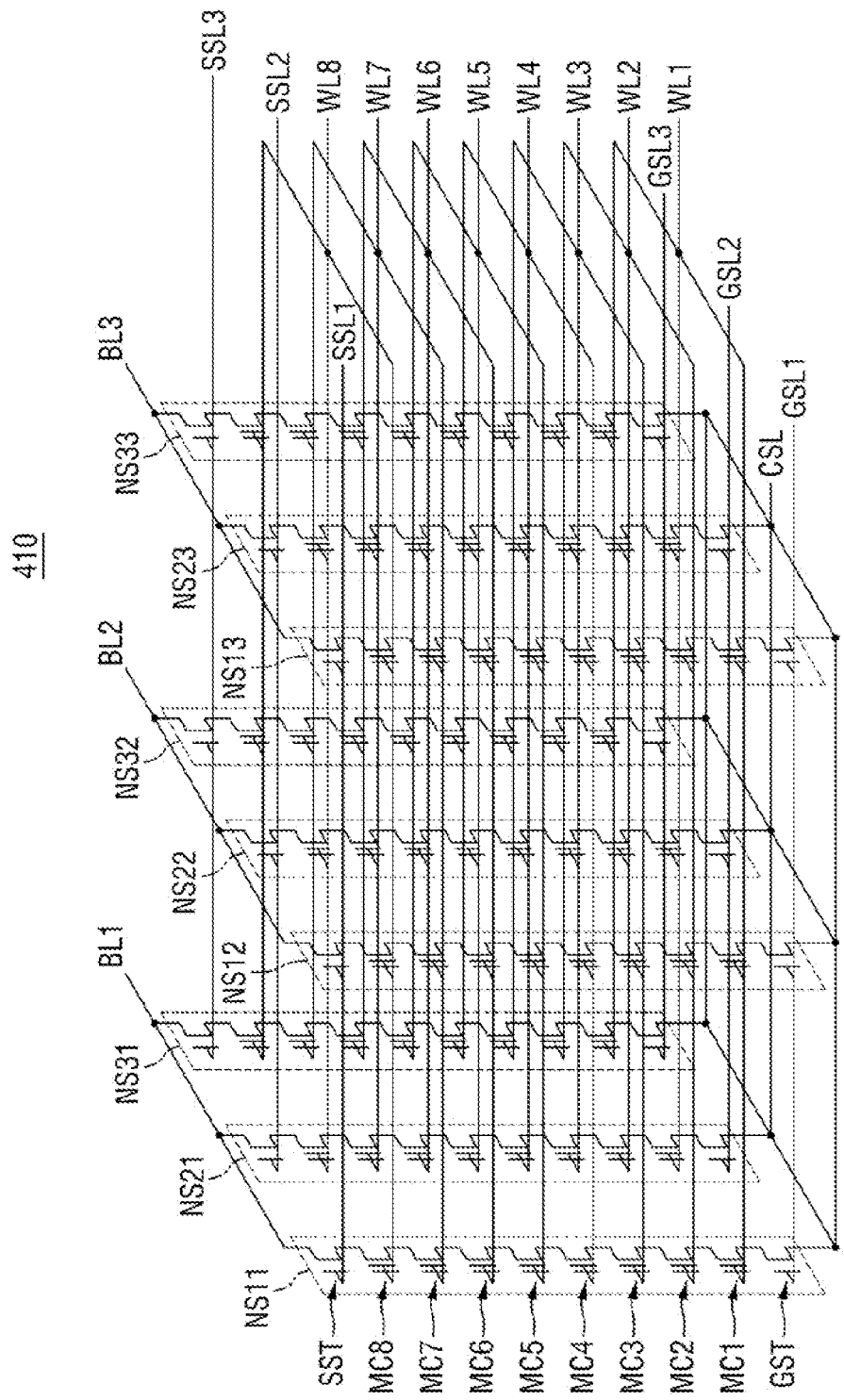
FIG. 3 is an exemplary circuit diagram showing a memory cell array in the storage device including the semiconductor package according to an exemplary embodiment of the inventive concept.

FIG. 3 is an exemplary circuit diagram showing a memory cell array in the storage device including the semiconductor package according to an exemplary embodiment of the inventive concept.

The memory cell array 410 may be connected to the address decoder 420 through a string selection line SSL, a plurality of word lines WLs, and a ground selection line GSL. Further, the memory cell array 410 may be connected to the page buffer circuit 430 through a plurality of bit lines BLs. The memory cell array 410 may include a plurality of memory cells connected to the plurality of word lines WLs and the plurality of bit lines BLs.

In some embodiments, the memory cell array 410 may be a three-dimensional memory cell array formed as a three-dimensional structure (or a vertical structure) on a substrate. In this case, the memory cell array 410 may include vertical memory cell strings including a plurality of memory cells formed by being stacked on each other. However, embodiments of the present inventive concept are not limited thereto, and the memory cell array 410 may be a two-dimensional memory cell array formed as a two-dimensional structure (or a horizontal structure) on the substrate.

The memory cell array 410 will be described in detail with reference to FIG. 3. The memory cell array 410 may include a plurality of memory cell strings NS11 and NS33 connected between the bit lines BL1 to BL3 and the common source line CSL. Each of the plurality of memory cell strings NS11 and NS33 may include a string selection transistor SST, a plurality of memory cells MC1, MC2, . . . , MC8 and a ground selection transistor GST. Although FIG. 3 shows that each of the plurality of memory cell strings NS11 and NS33 includes eight memory cells MC1 to MC8, the number and type thereof are not limited thereto.

The string selection transistor SST may be connected to the corresponding string selection line SSL. Each of the plurality of memory cells MC1, MC2, . . . , MC8 may be connected to corresponding word lines WL1, WL2, . . . , WL8. The ground selection transistor GST may be connected to a corresponding one of the ground selection lines GSL1 to GSL3. The string selection transistor SST may be connected to a corresponding one of the bit line BL1 to BL3, and the ground selection transistor GST may be connected to the common source line CSL. Although FIG. 3 shows that the memory cell array 410 is connected to eight word lines WL1 to WL8 and three bit lines BL1 to BL3, embodiments of the present inventive concept are not limited thereto.

Referring to FIGS. 1 and 2 again, the control circuit 460 may receive the command signal CMD and the address signal ADDR from the controller 200, and may control a program operation, a reading operation, or an erasing operation of the memory cell array 410, on the basis of the command signal CMD and the address signal ADDR.

For example, the control circuit 460 may generate control signal CONs for controlling the voltage generator 450 on the basis of the command signal CMD, and may generate a row address R_ADDR and a column address C_ADDR on the basis of the address signal ADDR. The control circuit 460 may provide the row address R_ADDR to the address decoder 420 and may provide the column address C_ADDR to the data I/O circuit 440.

The address decoder 420 may be connected to the memory cell array 410 through the string selection line SSL, the plurality of word lines WLs, and the ground selection line GSL. At the time of the program operation or the reading operation, the address decoder 420 may determine one of a plurality of word lines WLs as a selection word line on the basis of the row address R_ADDR provided from the control circuit 460, and may determine the remaining word lines except the selection word line (or selected word line) among the plurality of word lines WLs as non-selection word lines.

The voltage generator 450 may generate the word line voltages VWLs required for the operation of the storage device 1200 on the basis of the control signals CONs provided from the control circuit 460. The word line voltages VWLs generated from the voltage generator 450 may be applied to the plurality of word lines WLs through the address decoder 420.

At the time of the program operation, the voltage generator 450 may generate a program voltage and a program pass voltage. The program voltage may be applied to a selection word line through the address decoder 420, and the program pass voltage may be applied to the non-selection word lines through the address decoder 420.

Further, at the time of the reading operation, the voltage generator 450 may generate a reading voltage and a reading pass voltage. The reading voltage may be applied to the selection word line through the address decoder 420, and the reading pass voltage may be applied to the non-selection word lines through the address decoder 420.

The page buffer circuit 430 may be connected to the memory cell array 410 through the plurality of bit lines BLs.

The page buffer circuit 430 may include a plurality of page buffers. In some embodiments, one bit line among the bit lines BLs may be connected to one page buffer. In some embodiments, two or more bit lines among the bit lines BLs may be connected to one page buffer, without being limited thereto.

The page buffer circuit 430 may temporarily store data to be programmed in a selected page at the time of the program operation, and may temporarily store data which is read from the selected page at the time of the reading operation.

The data I/O circuit 440 may be connected to the page buffer circuit 430 through the data line DL. At the time of the program operation, the data I/O circuit 440 receives the program data DATA from the controller 200, and may provide the program data DATA to the page buffer circuit 430, on the basis of the column address C_ADDR provided from the control circuit 460. At the time of the reading operation, the data I/O circuit 440 may provide the read data DATA stored in the page buffer circuit 430 to the controller 200, on the basis of the column address C_ADDR provided from the control circuit 460.

In an exemplary embodiment, an external electric signal (e.g., a command signal CMD, an address signal ADDR, and/or data DATA) transmitted from the controller 200 may be transmitted from the controller 200 through one channel. Thereafter, the external electric signal transmitted through one channel may be diverged and transferred to the nonvolatile memory package according to some embodiments. At this time, by placing the diverged point inside the substrate in the nonvolatile memory package according to an exemplary embodiment of the inventive concept, the density of the semiconductor package may be improved, and the speed of the external electric signal transmitted from the controller 200 can also be improved. This will be described in detail with reference to the following drawings.

Figure 4:
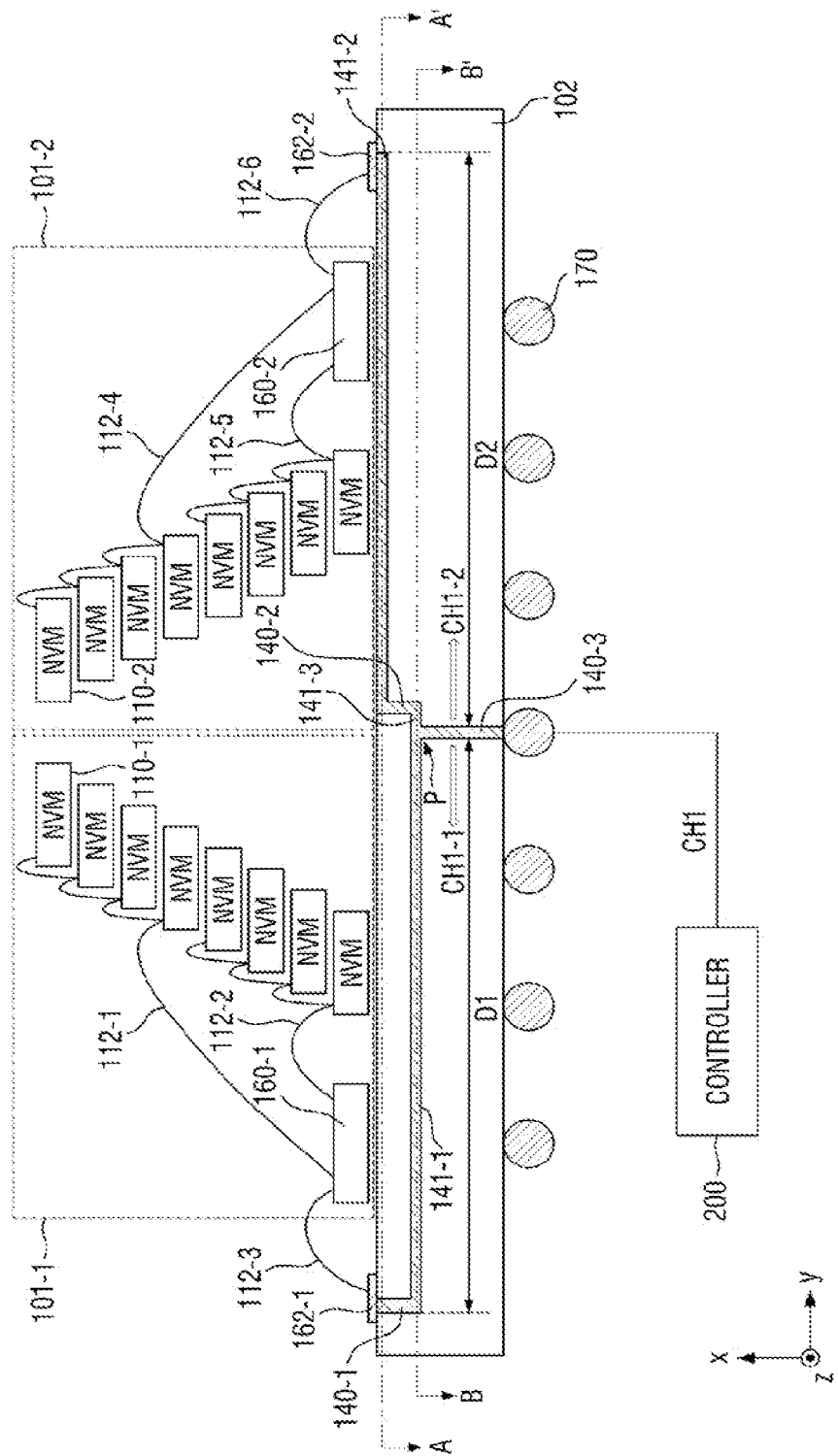
FIG. 4 is an exemplary diagram showing a semiconductor package according to an exemplary embodiment of the inventive concept.

FIG. 4 is an exemplary diagram showing a semiconductor package according to an exemplary embodiment of the inventive concept.

Referring to FIG. 4, the semiconductor package according to an exemplary embodiment of the inventive concept includes a first sub-nonvolatile memory package 101-1 and a second sub-nonvolatile memory package 101-2.

In an exemplary embodiment, the first sub-nonvolatile memory package 101-1 and the second sub-nonvolatile memory package 101-2 are placed on the single same substrate 102. A plurality of external connection terminals 170 may be formed below the substrate 102 to receive external electric signals. The external connection terminals 170 may directly contact the substrate 102. For example, at least one of the plurality of external connection terminals 170 may receive an external electric signal (e.g., a command signal, an address signal, and/or a data signal) through a first channel CH1 from the controller 200.

The first sub-nonvolatile memory package 101-1 and the second sub-nonvolatile memory package 101-2 may include a first nonvolatile memory chip 110-1 and a second nonvolatile memory chip 110-2, respectively. The first nonvolatile memory chip 110-1 and/or the second nonvolatile memory chip 110-2 included in each of the first sub-nonvolatile memory package 101-1 and the second sub-nonvolatile memory package 101-2 may include a NAND flash memory, a vertical NAND flash memory (VNAND), a NOR flash memory, and a resistive random access memory (RRAM), a phase-change memory (PRAM), a magnetoresistive random access memory (MRAM), a ferroelectric random access memory (FRAM), or a spin transfer torque random access memory (STT-RAM). Also, the first nonvolatile memory chip 110-1 and/or the second nonvolatile memory chip 110-2 according to some embodiments may include a three-dimensional array structure.

The first nonvolatile memory chip 110-1 and the second nonvolatile memory chip 110-2 are placed on the substrate 102, and each of the first nonvolatile memory chip 110-1 and the second nonvolatile memory chip 110-2 may include a plurality of nonvolatile memory chips. The shape of the plurality of nonvolatile memory chips on which the first nonvolatile memory chip 110-1 and the second nonvolatile memory chip 110-2 are formed is not limited to this drawing.

The first sub-nonvolatile memory package 101-1 and the second sub-nonvolatile memory package 101-2 may include a first buffer chip 160-1 and a second buffer chip 160-2, respectively. The first buffer chip 160-1 and the second buffer chip 160-2 may be placed on the substrate 102. Each of the first buffer chip 160-1 and the second buffer chip 160-2 may be electrically connected to the first nonvolatile memory chips 110-1 and the second nonvolatile memory chips 110-2. In an exemplary embodiment, a buffer chip temporarily stores data that is to be written to a nonvolatile memory chip or that is read from a nonvolatile memory chip.

In an exemplary embodiment, the first buffer chip 160-1 is electrically connected to a first group of the plurality of first nonvolatile memory chips 110-1 through a first lead wire 112-1. Further in this embodiment, the first buffer chip 160-1 is electrically connected to a second other group of the plurality of first nonvolatile memory chips 110-1 through a second lead wire 112-2. In an exemplary embodiment, the second buffer chip 160-2 is electrically connected to a first group of the plurality of second nonvolatile memory chips 110-2 through a fourth lead wire 112-4. In addition in this embodiment, the second buffer chip 160-2 is electrically connected to a second other group of the plurality of second nonvolatile memory chips 110-2 through a fifth lead wire 112-5. While FIG. 4 shows each sub-nonvolatile memory package including two groups of semiconductor chips stacked on top of one another, in an alternate embodiment, each nonvolatile memory package only includes a single group and the lead wires 112-2 and 112-5 are omitted.

A first buffer pad 162-1 and a second buffer pad 162-2 may be placed on the substrate 102. The first buffer pad 162-1 and/or the second buffer pad 162-2 may include a conductive substance. For example, the first buffer pad 162-1 and the second buffer pad 162-2 may include gold (Au), silver (Ag), copper (Cu), nickel (Ni) or aluminum (Al). In an exemplary embodiment, the first buffer pad 162-1 is electrically connected to the first buffer chip 160-1 through a third lead wire 112-3. In an exemplary embodiment, the second buffer pad 162-2 is electrically connected to the second buffer chip 160-2 through a fifth lead wire 112-5.

The first buffer pad 162-1 and the second buffer pad 162-2 may be connected to rewiring patterns 140-1, 140-2, 140-3, 141-1, 141-2, and 141-3. In an exemplary embodiment, the rewiring patterns 140-1, 140-2, 140-3, 141-1, 141-2, and 141-3 are placed inside the substrate 102. The rewiring patterns 140-1, 140-2, 140-3, 141-1, 141-2, and 141-3 may be further electrically connected to at least some of the plurality of external connection terminals 170. The rewiring patterns 140-1, 140-2, 140-3, 141-1, 141-2, and 141-3 and the plurality of external connection terminals 170 may include gold (Au), silver (Ag), copper (Cu), nickel (Ni) or aluminum (Al).

In the following drawings, although the plurality of external connection terminals 170 is shown as solder balls, embodiment of the present inventive concept is not limited thereto. For example, the plurality of external connection terminals 170 may be solder bumps, grid arrays, or conductive tabs. Further, the number and arrangement form of the plurality of external connection terminals 170 are not limited to the number and arrangement form shown in this drawing.

That is, an external electric signal (e.g., a first channel signal) transmitted from the controller 200 may be transmitted to at least one of the external connection terminals 170 through the first channel CH1. At least one of the external connection terminals 170 may be electrically connected to the rewiring patterns 140-1, 140-2, 140-3, 141-1, 141-2, and 141-3. The rewiring patterns 140-1, 140-2, 140-3, 141-1, 141-2, and 141-3 may be electrically connected to the first buffer pad 162-1 and the second buffer pad 162-2. Consequentially, the external electric signal (e.g., the first channel signal) transmitted from the controller 200 may be transmitted to the first nonvolatile memory package 101-1 and the second nonvolatile package 101-2 through each of the first buffer chip 160-1 and the second buffer chip 160-2.

Signals transmitted to each of the first nonvolatile memory package 101-1 and the second nonvolatile memory package 101-2 may be different from each other. That is, the first channel signal CH1 transmitted from the controller 200 is transmitted along the third vertical rewiring pattern 140-3, and may be diverged into a 1-1$^{st}$ channel signal CH1-1 and a 1-2$^{nd}$ channel signal CH1-2 at the diverging point P.

More specifically, the 1-1$^{st}$ channel signal CH1-1 diverged from the first channel signal CH1 at the diverging point P moves along the first horizontal rewiring pattern 141-1, and is transmitted to the first buffer pad 162-1 through the first vertical rewiring pattern 140-1 connected to the first horizontal rewiring pattern 141-1. The 1-2$^{nd}$ channel signal CH1-2 diverged from the first channel signal CH1 is transmitted to the second buffer pad 162-2 through a third horizontal rewiring pattern 141-3, a second vertical rewiring pattern 140-2 connected to the third horizontal rewiring pattern 141-3, and a second horizontal rewiring pattern 141-2 connected to the second vertical rewiring pattern 140-2.

That is, the first channel signal CH1 received from the controller 200 is diverged at the diverging point P in the substrate 102, the respective diverged 1-1$^{st}$ channel signals CH1-1 is transmitted to the first nonvolatile memory package 101-1 including the first nonvolatile memory chip 110-1, and the diverged 1-2$^{nd}$ channel signal CH1-2 is transmitted to the second nonvolatile memory package 101-2 including the second nonvolatile memory chip 110-2.

In the semiconductor package according to an exemplary embodiment of the inventive concept, by diverging an external signal (e.g., a control signal, etc.) received from the controller 200 inside the substrate 102, the degree of integration of the semiconductor package according to some embodiments can be enhanced, the signals transmitted from the controller 200 can be diverged more, and it is possible to improve the operation speed of the storage device including the semiconductor package according to some embodiments.

In the embodiment shown in FIG. 4, the diverging point P is located at the center in the second direction y in which the first buffer chip 160-1 and the second buffer chip 160-2 are spaced apart from each other. For example, the dividing point P may be located at a center of the substrate 120. In an exemplary embodiment, a first length D1 from the diverging point P to the point on which the first buffer pad 162-1 meets or contacts the rewiring pattern 140-1 is the same as a second length D2 from the diverging point P to the point on which the second buffer pad 162-2 meets or contacts the rewiring pattern 141-2. That is, the first channel signal CH1 is diverged at the diverging point P, and the lengths by which each of the 1-1$^{st}$ channel signal CH1-1 and the 1-2$^{nd}$ channel signal CH1-2 is transmitted to each of the first buffer pad 162-1 and the second buffer pad 162-2 may be the same.

In an exemplary embodiment, the length of the paths 141-1 and 140-1 along which the 1-1$^{st}$ channel signal CH1-1 diverged from the first channel signal CH1 moves is equal to the length of the paths 141-3, 140-2 and 141-2 along which the 1-2$^{nd}$ channel signal CH1-2 diverged from the first channel signal CH1 moves.

The first buffer chip 160-1 and/or the second buffer chip 160-2 may include a plurality of I/O terminals. If a connection between the plurality of I/O terminals between the first buffer chip 160-1 and the second buffer chip 160-2 is performed inside the substrate 102, the connection lines of the plurality of different I/O terminals may become entangled with each other. In an exemplary embodiment of the inventive concept, the rewiring pattern 141-1 connected to the first buffer chip 160-1 and the rewiring pattern 141-2 connected to the second buffer chip 160-2 are placed in different layers from each other such that the connections of the same I/O terminals are not entangled with each other. This will be described in detail with reference to FIGS. 5 and 6 below. In an exemplary embodiment, a depth of the rewiring pattern 141-1 differs from a depth of the rewiring pattern 141-2, within the substrate 102.

Figure 5:
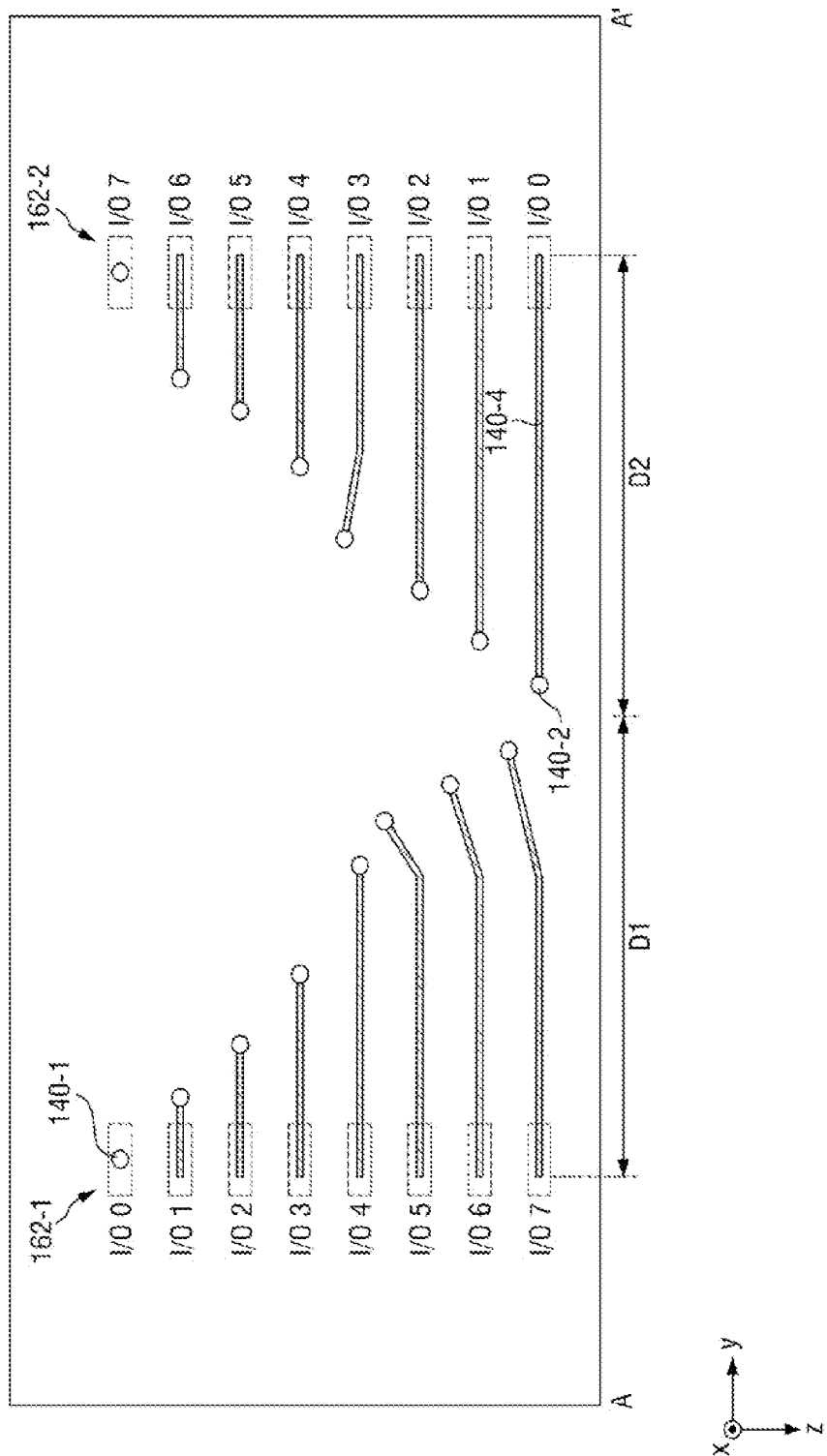
FIG. 5 is a cross-sectional view of the semiconductor package of FIG. 4 according to an exemplary embodiment taken along a line A-A'.
Figure 6:
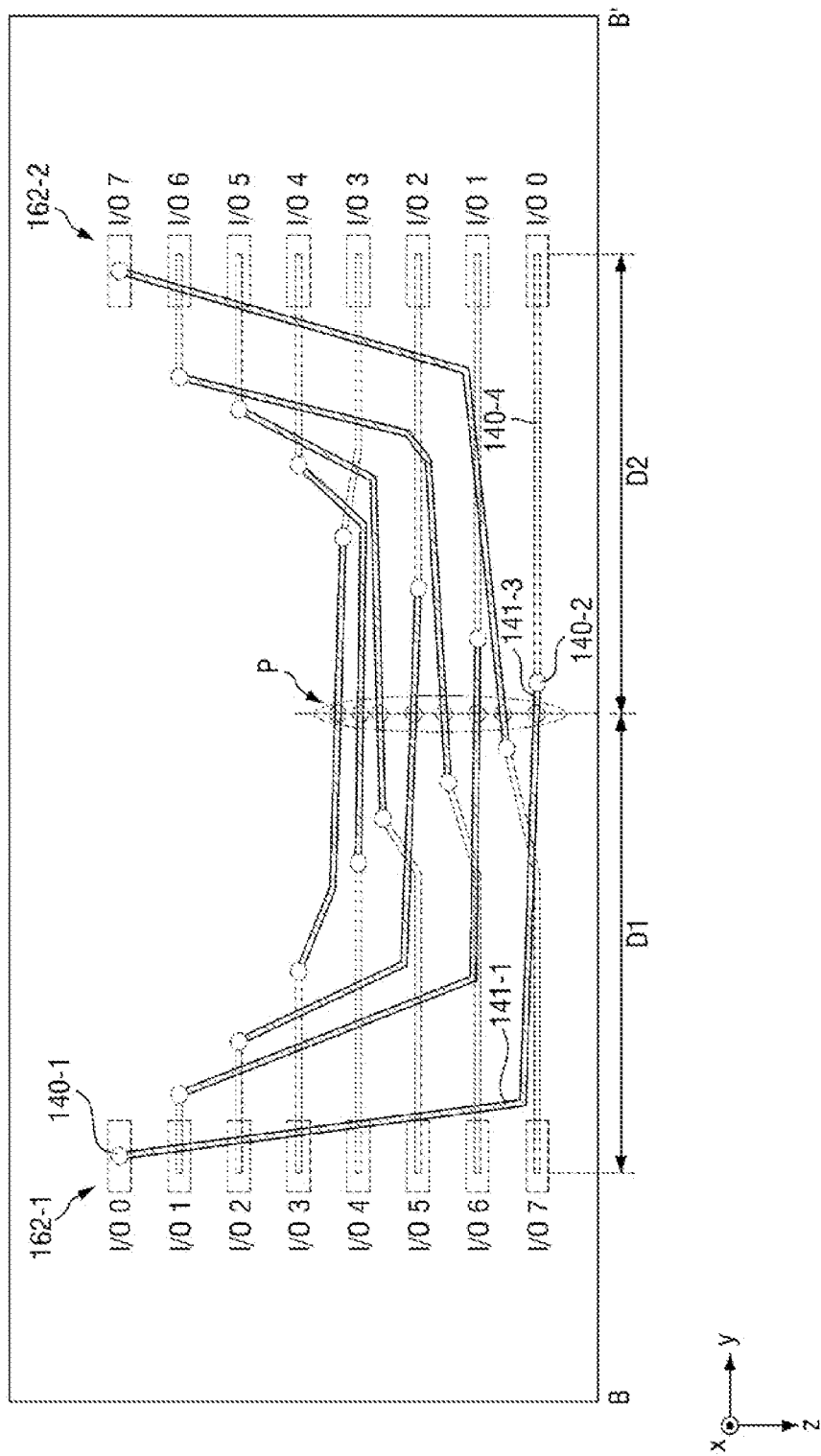
FIG. 6 is a cross-sectional view of the semiconductor package of FIG. 4 according to an exemplary embodiment taken along a line B-B'.

FIG. 5 is a cross-sectional view of the semiconductor package of FIG. 4 according to an exemplary embodiment of the inventive concept taken along a line A-A'. FIG. 6 is a cross-sectional view of the semiconductor package of FIG. 4 according to an exemplary embodiment of the inventive concept taken along a line B-B'. Hereinafter, for convenience of description, a layer taken along the line A-A' is referred to as a first layer, and a layer taken along the line B-B' is referred to as a second layer.

Referring to FIG. 5, each of the first buffer pad 162-1 and the second buffer pad 162-2 includes a plurality of I/O pads I/O 0 to I/O 7. The form and number of the plurality of I/O pads I/O 0 to I/O 7 are not limited to those shown in FIG. 5. For convenience of explanation, the respective I/O pads I/O 0 to I/O 7 or portions thereof placed above the first layer are indicated by dotted lines.

In the first layer, a rewiring pattern (e.g., 140-4) is formed on each of the I/O pads I/O 0 to I/O 7. In an exemplary embodiment, the rewiring patterns formed to be connected to the respective I/O pads I/O 0 to I/O 7 do not intersect each other. At the end of the rewiring pattern formed from each of the I/O pads I/O 0 to I/O 7, the rewiring pattern to be connected to the lower layer (e.g., the second layer) is formed in the first direction x (for example, 140-2). Like the first I/O pad I/O 0 of the first buffer pad 162-1 and the eighth I/O pad I/O 7 of the second buffer pad 162-2, a rewiring pattern (e.g., 140-1) to be directly connected to the lower layer may also be formed in the pad.

The rewiring pattern of the second layer will be described with reference to FIG. 6. In order to merge the I/O pads I/O 0 to I/O 7 of the first buffer pad 162-1 and the I/O pads I/O 0 to I/O 7 of the second buffer pad 162-2 inside the substrate, the rewiring pattern (e.g., 141-1 and 141-3) may be formed from the rewiring pattern (e.g., 140-2) connecting the first layer to the second layer.

The first I/O pad I/O 0 of the first buffer pad 162-1 and the first I/O pad I/O 0 of the second buffer pad 162-2 will be described in detail as an example. The first I/O pad I/O 0 of the first buffer pad 162-1 has a first vertical rewiring pattern 140-1 formed in the first layer to electrically connect the first layer and the second layer. The first I/O pad I/O 0 of the second buffer pad 162-2 is connected to the fourth horizontal rewiring pattern 141-4 in the first layer to electrically connect the first layer and the second layer through the second vertical rewiring pattern 140-2.

Thereafter, in the second layer, the first I/O pad I/O 0 is connected from the first vertical rewiring pattern 140-1 to the diverging point P through the first horizontal rewiring pattern 141-1, and is connected from the second vertical rewiring pattern 140-2 to the diverging point P through a third horizontal rewiring pattern 141-3. That is, the first horizontal rewiring pattern 141-1 formed in the second layer may not be entangled with the rewiring pattern (a portion shown by the dotted line) formed in the first layer.

That is, since the diverging point P is formed in a layer (e.g., the second layer) lower than the rewiring pattern layer (e.g., the first layer) formed by directly meeting the first buffer pad 162-1 and the second buffer pad 162-2, when connecting the I/O pads I/O 0 to I/O 7 in the first buffer pad 162-1 and the second buffer pad 162-2 different from each other, they may not be disconnected from each other. The layers exemplified herein are not limited thereto, and may include various forms of layers.

FIGS. 7 to 12 are exemplary diagrams showing other semiconductor packages according to some exemplary embodiments of the inventive concept. Hereinafter, repeated explanation of the aforementioned contents will not be provided, and differences will be mainly described.

Figure 7:
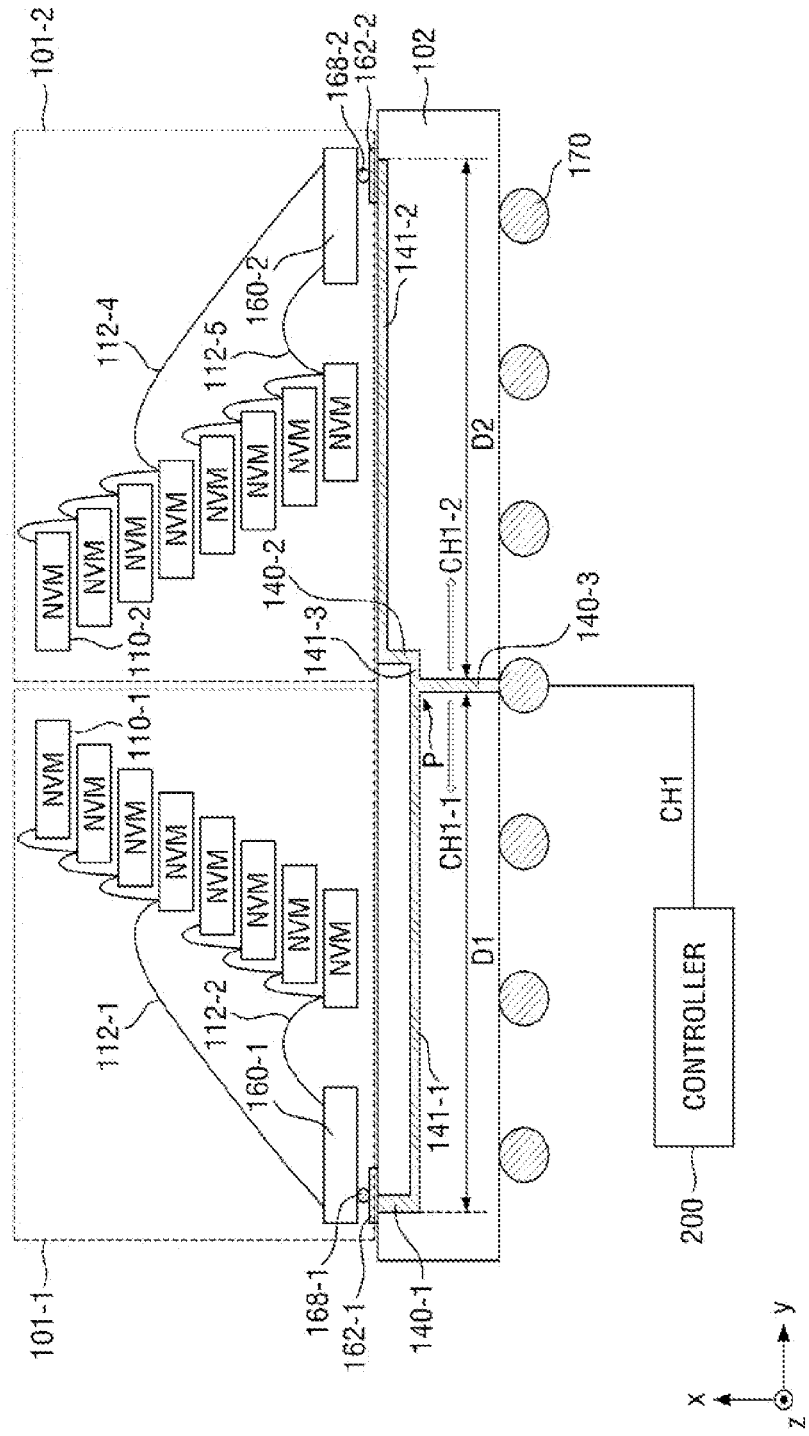
FIGS. 7 to 12 are exemplary diagrams showing other semiconductor packages according to some exemplary embodiments of the inventive concept.

Referring to FIG. 7, unlike FIG. 4, the first buffer chip 160-1 and/or the second buffer chip 160-2 may be electrically connected to the rewiring patterns 140-1, 140-2, 140-3, 141-1, 141-2, and 141-3 in the form of flip chips.

In an exemplary embodiment, a first connection terminal 168-1 connected to the first buffer chip 160-1 is electrically connected to the first buffer pad 162-1. In the embodiment, a second connection terminal 168-2 connected to the second buffer chip 160-2 is electrically connected to the second buffer pad 162-2. The first connection terminal 168-1 and/or the second connection terminal 168-2 may include gold (Au), silver (Ag), copper (Cu), nickel (Ni) or aluminum (Al). The first connection terminal 168-1 and/or the second connection terminal 168-2 may be, for example, a solder ball, a solder bump or a combination thereof.

Figure 8:
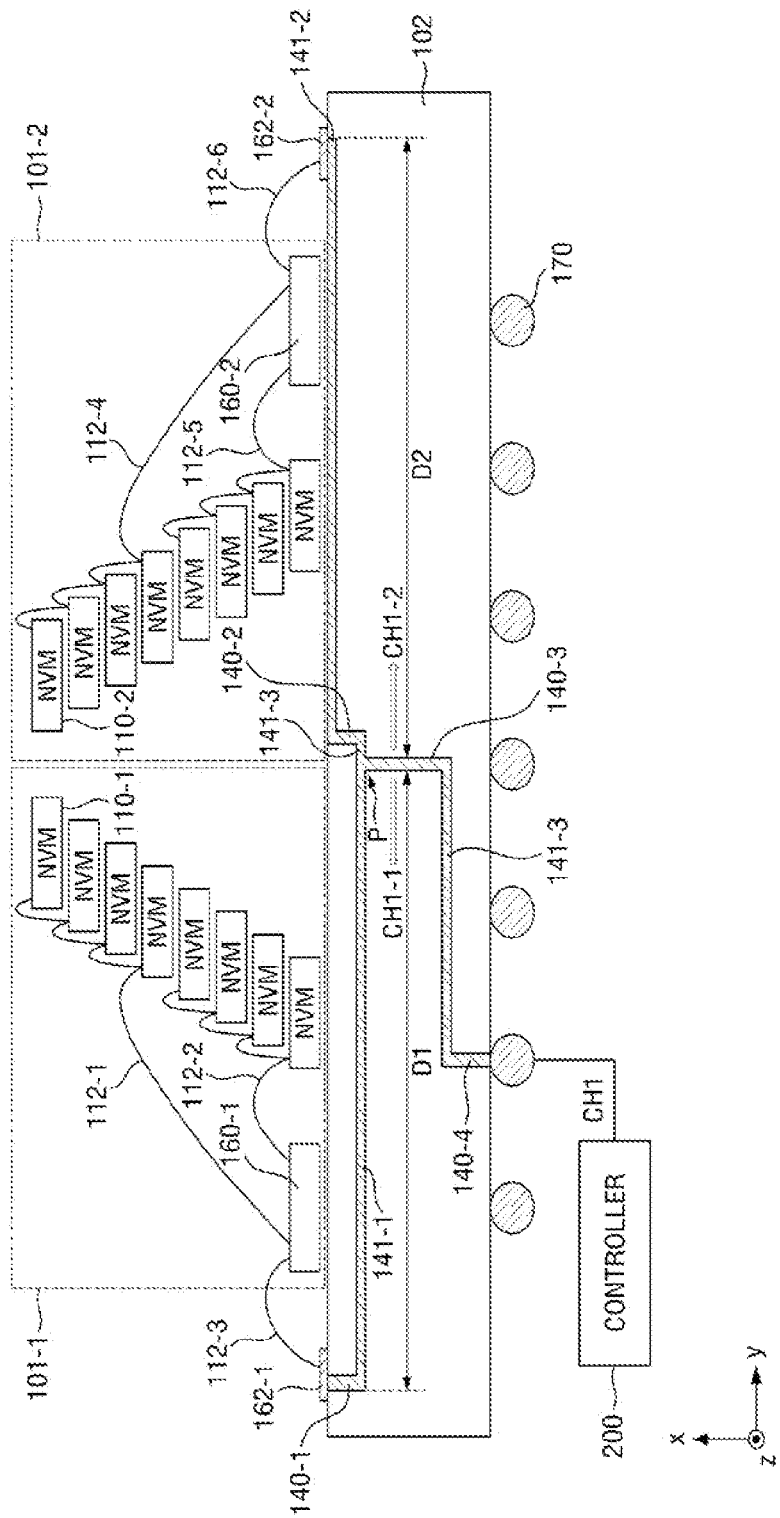

Referring to FIG. 8, unlike FIG. 4, at least some of the plurality of external connection terminals 170, to which the first channel signal CH1 transmitted from the controller 200 is connected, is not an external connection terminal 170 located in a direction descending vertically in the first direction x from the diverging point P. That is, the signal before the external signal is diverged may be transmitted from the outside (e.g., the controller 200) without restriction of some paths. For example, the connection terminal 170 connected to the diverging point P need not be directly below the diversion P and can instead be offset a distance to the left of center as such that shown in FIG. 8. Alternately, the connection terminal 170 connected to the diverging point P can be offset a distance to the right of center.

Figure 9:
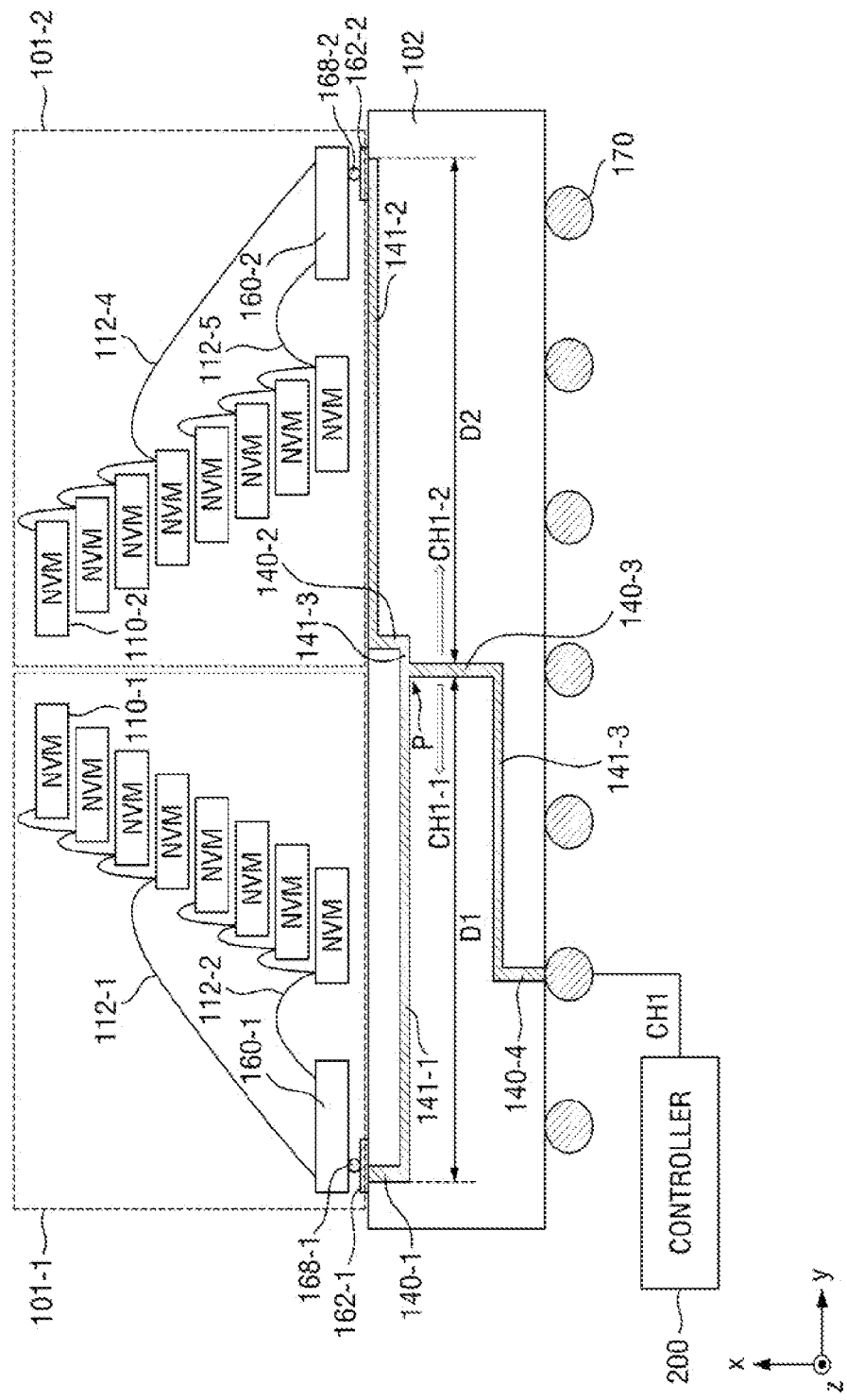

Referring to FIG. 9, unlike FIG. 8, the first buffer chip 160-1 and the second buffer chip 160-2 are electrically connected to the rewiring patterns 140-1, 140-2, 140-3, 141-1, 141-2, and 141-3 in the form of flip chips, respectively.

Figure 10:
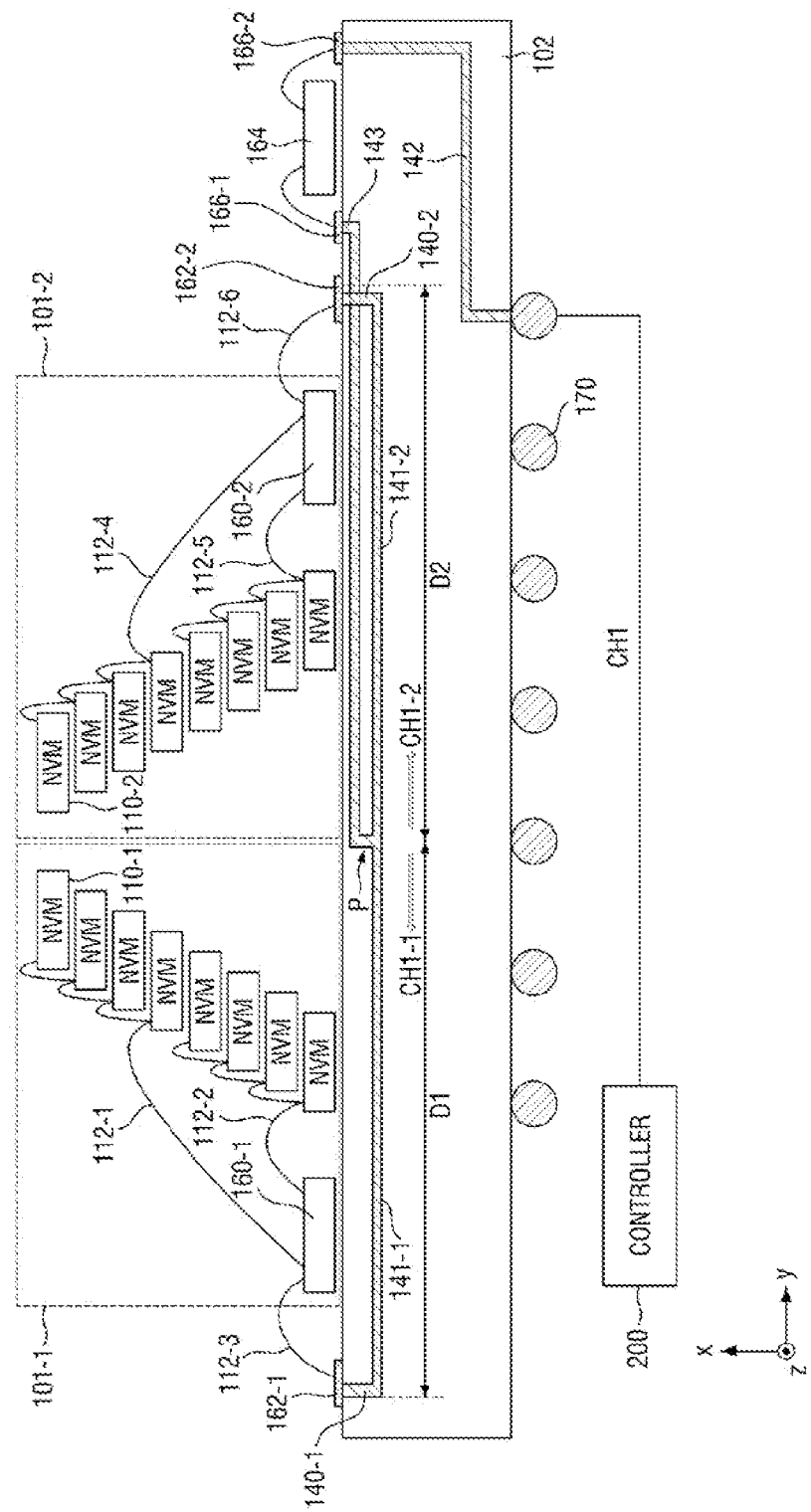

Referring to FIG. 10, a semiconductor package according to an exemplary embodiment of the inventive concept further includes a diverging chip 164.

The diverging chip 164 may be placed on the substrate 102. For example, a bottom surface of the diverging chip 164 may contact an upper surface of the substrate 102.

The diverging chip 164 may receive transmission of the first channel signal CH1, which is received from the controller 200, through the rewiring pattern 142. More specifically, the diverging chip 164 may be electrically connected to a second diverging chip pad 166-2, and may receive the first channel signal CH1.

Thereafter, the diverging chip 164 may transmit the first channel signal CH1 to the diverging point P through the rewiring pattern 143. In an exemplary embodiment, the diverging chip 164 is electrically connected to the first diverging chip pad 166-1, and transmits the first channel signal CH1 to the rewiring pattern 143. In an exemplary embodiment, the diverging chip 164 is connected to the diverging chip pad 166-1 and 166-2 via respective lead wires. In an exemplary embodiment, the diverging chip 164 is implemented by a transmitter. In an exemplary embodiment, the diverging chip 164 includes an amplifier that can be used to boost a strength of the first channel signal CH1 under certain conditions.

The first diverging chip pad 166-1 and/or the second diverging chip pad 166-2 may include gold (Au), silver (Ag), copper (Cu), nickel (Ni) or aluminum (Al).

That is, the first channel signal CH1 may move to the diverging point P along the rewiring pattern 143 formed in the substrate 102. The first channel signal CH1 having moved to the diverging point P may be diverged into a 1-$1^{st}$ channel signal CH1-1 and a 1-$2^{nd}$ channel signal CH1-2. The diverged 1-$1^{st}$ channel signal CH1-1 may be transmitted to the first nonvolatile memory package 101-1 along the first horizontal rewiring pattern 141-1 and the first vertical rewiring pattern 140-1. Also, the diverged 1-$2^{nd}$ channel signal CH1-2 may be transmitted to the second nonvolatile memory package 101-2 along the second horizontal rewiring pattern 141-2 and the second vertical rewiring pattern 140-2.

In this drawing, although the first horizontal rewiring pattern 141-1 and the second horizontal rewiring pattern 141-2 are shown as being formed in the same layer, these patterns may be formed in different layers as shown in FIG. 4.

Figure 11:
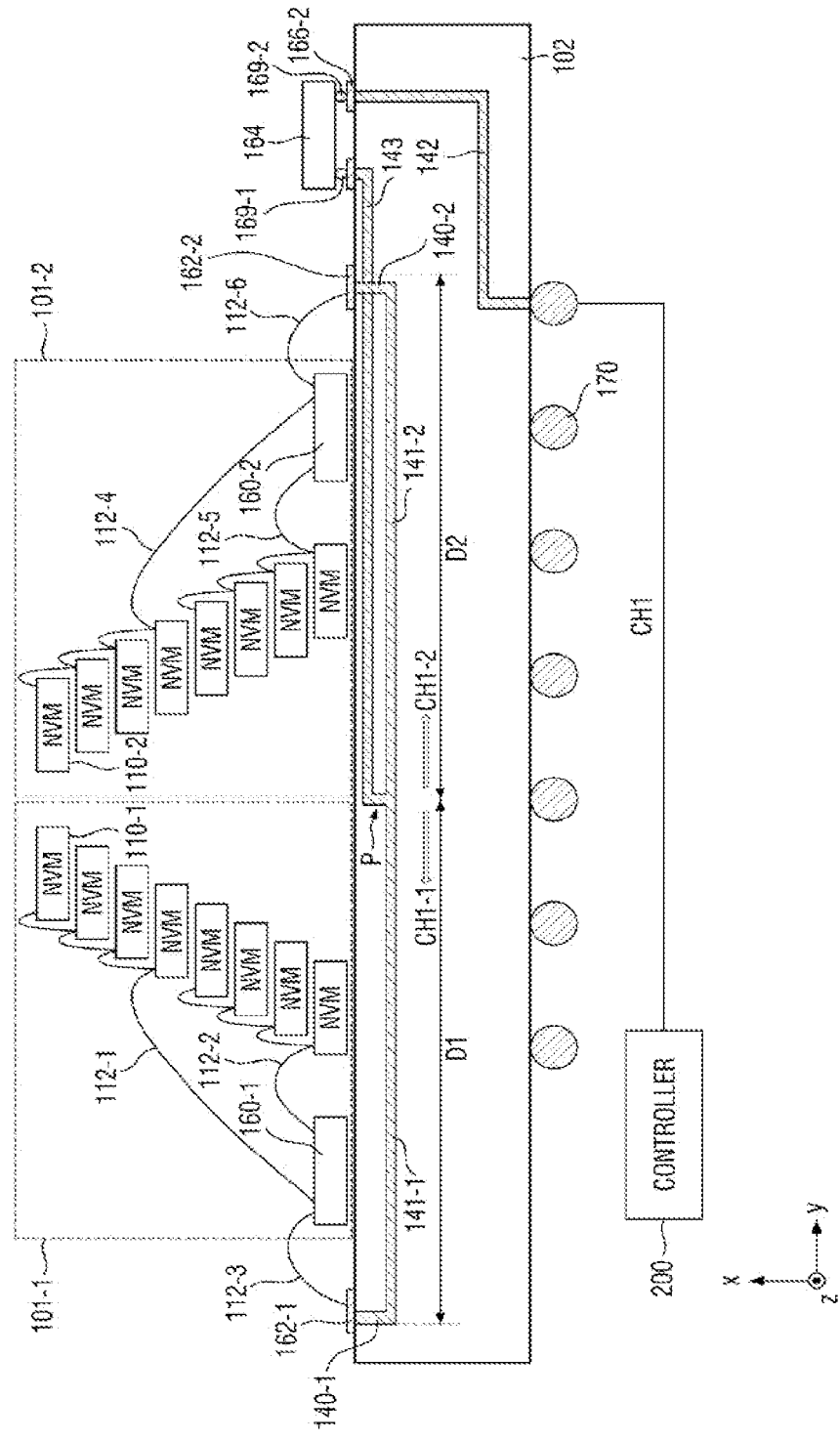

Referring to FIG. 11, unlike FIG. 10, the diverging chip 164 is electrically connected to the rewiring patterns 142 and 143 in the form of flip chips.

In an exemplary embodiment, the diverging chip 164 is electrically connected to the rewiring pattern 142 through s second diverging chip connection terminal 169-2, and may receive the first channel signal CH1 from the controller 200. In this embodiment, the diverging chip 164 is electrically connected to the rewiring pattern 143 through a first diverging chip connection terminal 169-1, and may transmit the first channel signal CH1 received from the controller 200 to the diverging point P. The first diverging chip connection terminal 169-1 and the second diverging chip connection terminal 169-2 may include gold (Au), silver (Ag), copper (Cu), nickel (Ni) or aluminum (Al).

Figure 12:
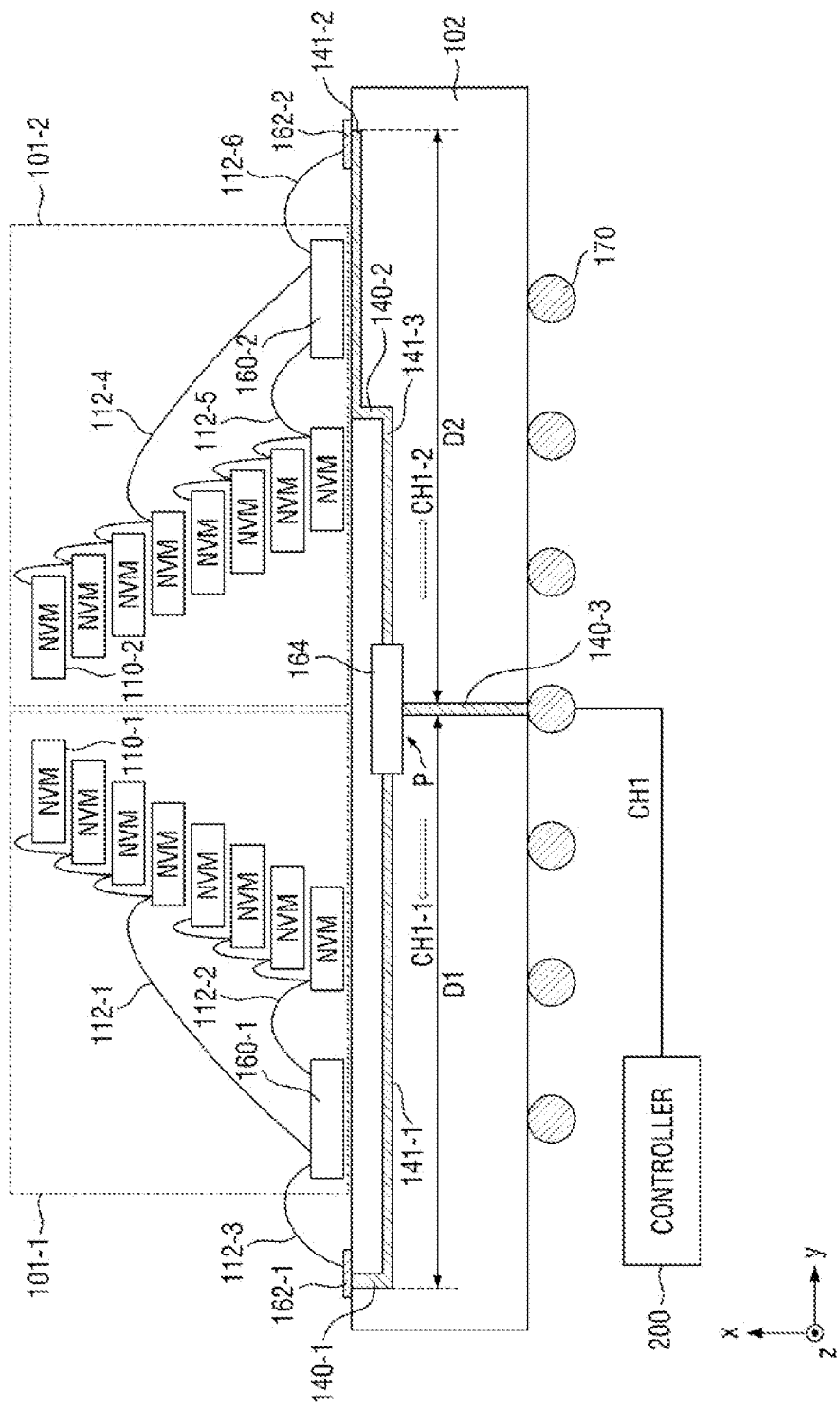

Referring to FIG. 12, unlike FIGS. 10 and 11, the diverging chip 164 is formed inside the substrate 102.

The diverging chip 164 according to an exemplary embodiment of the inventive concept is formed in the substrate 102 and receives the first channel signal CH1 transmitted from the controller 200. In an exemplary embodiment, the diverging chip 164 is electrically connected to the third vertical rewiring pattern 140-3, and the third vertical rewiring pattern 140-3 is electrically connected to at least one of a plurality of external connection terminals 170 and receives the first channel signal CH1 from the controller 200.

Thereafter, the diverging chip 164 may serve as the diverging point P. That is, the diverging chip 164 may receive the first channel signal CH1 and diverge (e.g., split) it into the 1-1$^{st}$ channel signal CH1-1 and the 1-2$^{nd}$ channel signal CH1-2. The diverged 1-1$^{st}$ channel signal CH1-1 may be transmitted to the first nonvolatile memory package 101-1 along the first horizontal rewiring pattern 141-1 and the first vertical rewiring pattern 140-1. Further, the diverged 1-2$^{nd}$ channel signal CH1-2 may be transmitted to the second nonvolatile memory package 101-2 along the third horizontal rewiring pattern 141-3, the second vertical rewiring pattern 140-2, and the second horizontal rewiring pattern 141-2.

In this drawing, although the first horizontal rewiring pattern 141-1 and the second horizontal rewiring pattern 141-2 are shown as being formed in the same layer, they may be formed in different layers from each other as shown in FIG. 4.

Figure 13:
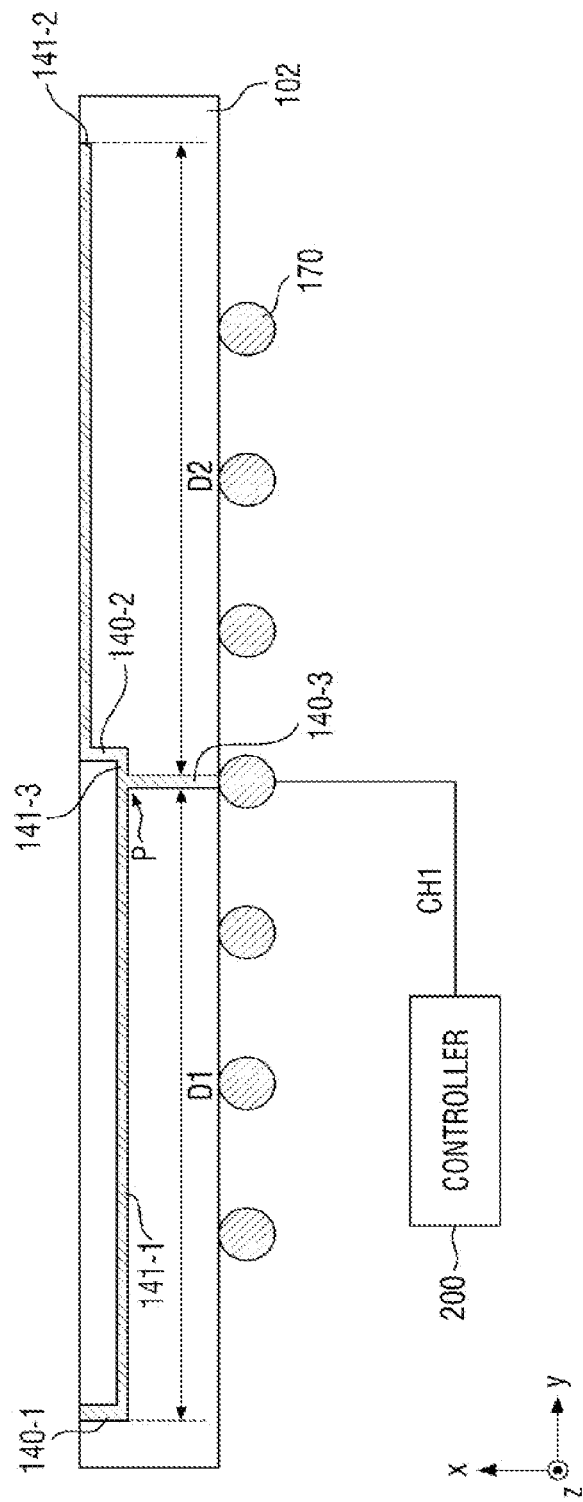
FIGS. 13 to 14 are exemplary diagrams for explaining intermediate steps of a method for fabricating a semiconductor package according to an exemplary embodiment of the inventive concept.
Figure 14:
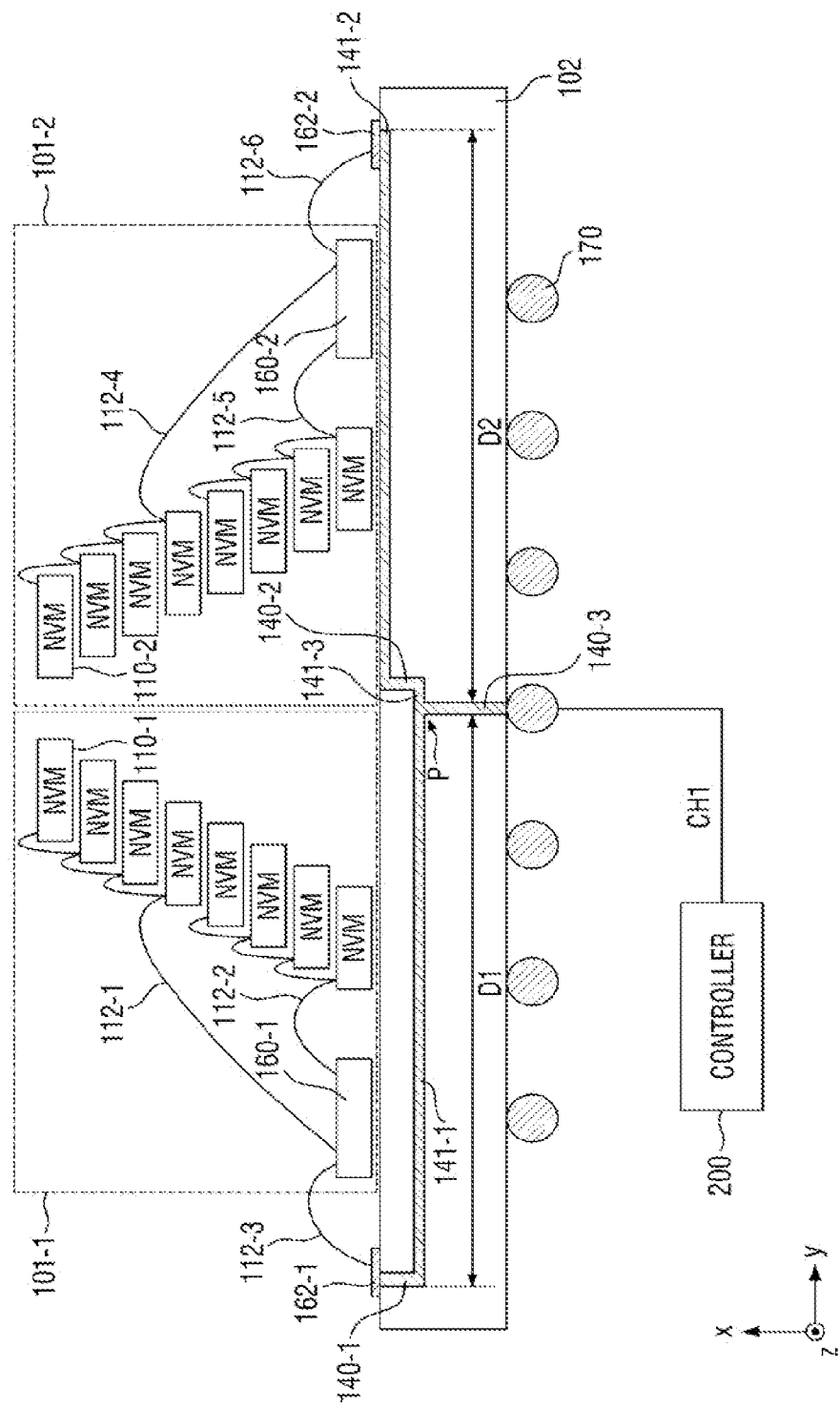

FIGS. 13 to 14 are exemplary diagrams for explaining intermediate steps of a method for fabricating a semiconductor package according to an exemplary embodiment of the inventive concept.

First, referring to FIG. 13, a rewiring pattern for diverging the external electric signal (e.g., the first channel signal CH1) is formed inside the substrate 102. In an exemplary embodiment, a third vertical rewiring pattern 140-3 extending vertically in the first direction x around the diverging point P is formed, and a first horizontal rewiring pattern 141-1 and a third horizontal rewiring pattern 141-3 extending in the second direction y around the diverging point P are formed. In an exemplary embodiment, a first recess is formed in a bottom surface of the substrate 102 and the third vertical rewiring pattern 140-3 is formed in the first recess.

Although the first horizontal rewiring pattern 141-1 and the third horizontal rewiring pattern 141-3 are shown as being formed on the same layer in FIG. 13, embodiments of the inventive concept are not limited thereto.

In the embodiment, a first vertical rewiring pattern 140-1 connected to the first horizontal rewiring pattern 141-1 and extending in the first direction x is formed inside the substrate 102. In an exemplary embodiment, a second recess is formed in a top surface of the substrate 102 and the first vertical rewiring pattern 140-1 is formed in the second recess. Further in the embodiment, a second vertical rewiring pattern 140-2 connected to the third horizontal rewiring pattern 141-3 and extending in the first direction x is formed. In an exemplary embodiment, a third recess is formed in the top surface of the substrate 102 and the second vertical rewiring pattern 140-2 is formed in the third recess. Thereafter, a second horizontal rewiring pattern 141-2 connected to the second vertical rewiring pattern 140-2 is formed. For example, a fourth recess wider than the third recess and adjacent to the third recess maybe formed in the top surface of the substrate, and the second horizontal rewiring pattern 141-2 may be formed in the fourth recess. The recesses described above may be formed by performing an etching to remove portions of the substrate 102.

The rewiring patterns 140-1, 140-2, 140-3, 141-1, and 141-2 may be located inside the substrate 102. Additionally, one or more external connection terminals 170 for receiving the external electric signal (e.g., the first channel signal CH1 received from the controller 200) are formed.

That is, at least one of the plurality of external connection terminals 170 receives the first channel signal CH1 transmitted from the controller 200, and may transmit it to the third vertical rewiring pattern 140-3. For example, one of the external connection terminals 170 is formed to contact the third vertical rewiring pattern 140-3.

Hereinafter, referring to FIG. 14, the first nonvolatile memory package 101-1 and the second nonvolatile memory package 101-2 are formed on the substrate 102. Each of the first nonvolatile memory package 101-1 and the second nonvolatile memory package 101-2 may be formed including a first buffer chip 160-1 and a second buffer chip 160-2, and first nonvolatile memory chips 110-1 and second nonvolatile memory chips 110-2.

A first buffer pad 162-1 and a second buffer pad 162-2 electrically connected to each of the first nonvolatile memory chip 110-1 and the second nonvolatile memory chip 110-2 may also be formed on the substrate 102. For example, the lead wire 112-3 may be formed to connect the first buffer pad 162-1 to the first buffer chip 160-1, the lead wire 112-1 may be formed to connect the first buffer chip 160-1 to a first group of nonvolatile memory chips of the first nonvolatile memory package 101-1, the lead wire 112-2 may be formed to connect the first buffer chip 160-1 to a second group of nonvolatile memory chips of the first nonvolatile memory package 101-1, the lead wire 112-6 may be formed to connect the second buffer pad 162-2 to the second buffer chip 160-2, the lead wire 112-4 may be formed to connect the second buffer chip 160-2 to a first group of nonvolatile memory chips of the second nonvolatile memory package 101-2, and the lead wire 112-5 may be formed to connect the second buffer chip 160-2 to a second group of nonvolatile memory chips of the second nonvolatile memory package 101-2.

In concluding the detailed description, those skilled in the art will appreciate that many variations and modifications may be made to these exemplary embodiments without substantially departing from the principles of the present inventive concept.

What is claimed is:

1. A semiconductor package comprising:
   a substrate;
   a first buffer pad and a second buffer pad located on an upper part of the substrate;
   a first buffer chip and a second buffer chip electrically connected to each of the first buffer pad and the second buffer pad;
   a plurality of nonvolatile memory chips located on the upper part of the substrate and including a first nonvolatile memory chip and a second nonvolatile memory chip, the first nonvolatile memory chip being electrically connected to the first buffer chip, and the second nonvolatile memory chip being electrically connected to the second buffer chip;
   a plurality of external connection terminals connected to a lower part of the substrate; and
   a rewiring pattern located inside the substrate, the rewiring pattern configured to diverge an external electric signal received through one of the plurality of external connection terminals into first and second signals, transmit the first signal to the first buffer chip and transmit the second signal to the second buffer chip,
   wherein the first buffer pad comprises a first_first I/O pad and a second_first I/O pad connecting the first buffer chip and the second buffer pad comprises a first second I/O pad and a second_second I/O pad connecting the second buffer chip,
   wherein the rewiring pattern comprises a first rewiring pattern connecting the first_first I/O pad and the first second I/O pad and a second rewiring pattern connecting the second_first I/O pad and the second_second I/O pad,
   wherein the external electric signal is diverged into the first and second signals at a plurality of diverging points in the rewiring pattern,
   the diverging points comprise a first diverging point at which the external electric signal is diverged into the first and second buffer chips in the first rewiring pattern and a second diverging point at which the external electric signal is diverged into the first and second buffer chips in the second rewiring pattern, and
   from a planar perspective, the first and second diverging points are spaced apart from each other in a direction parallel to the upper surface of the substrate.

2. The semiconductor package of claim 1, further comprising:
   a diverging chip, wherein the diverging chip receives the external electric signal from the one external connection terminal, and transmits the received external electric signal to the rewiring pattern.

3. The semiconductor package of claim 2, wherein the diverging chip is located on the upper part of the substrate.

4. The semiconductor package of claim 2, wherein the diverging chip is located inside the substrate.

5. The semiconductor package of claim 1, wherein the first buffer chip and the second buffer chip are spaced apart from each other in a first direction, and one of the first diverging point and the second diverging point is located at a center of the rewiring pattern in the first direction.

6. The semiconductor package of claim 1, further comprising:
   a controller, wherein the external electric signal is a control signal received from the controller.

7. The semiconductor package of claim 1, wherein the first rewiring pattern comprises:
   a first vertical rewiring pattern and a first horizontal rewiring pattern configured to transmit the first signal to the first buffer chip, and a second vertical rewiring pattern and a second horizontal rewiring pattern configured to transmit the second signal to the second buffer chip, the first vertical rewiring pattern and the second vertical rewiring pattern extend in a first direction, the first horizontal rewiring pattern and the second horizontal rewiring pattern extend in a second direction perpendicular to the first direction, and the first horizontal rewiring pattern is lower than the second horizontal rewiring pattern in the first direction.

8. The semiconductor package of claim 7, wherein the first rewiring pattern comprises a third vertical rewiring pattern including a first end connected to the one external connection terminal and extending in the first direction, and the electric signal is diverged at a second other end of the third vertical rewiring pattern.

9. The semiconductor package of claim 1, wherein the second rewiring pattern comprises:
   a fourth vertical rewiring pattern and a fourth horizontal rewiring pattern configured to transmit the first signal to the first buffer chip, and a fifth vertical rewiring pattern and a fifth horizontal rewiring pattern configured to transmit the second signal to the second buffer chip, the fourth vertical rewiring pattern and the fifth vertical rewiring pattern extend in a first direction, the fourth horizontal rewiring pattern and the fifth horizontal rewiring pattern extend in a second direction perpendicular to the first direction, and the fourth horizontal rewiring pattern is lower than the fifth horizontal rewiring pattern in the first direction.

10. The semiconductor package of claim 1, wherein the first buffer chip and the second buffer chip are connected to the rewiring pattern in a form of a flip-chip.

11. A semiconductor package comprising:
    a controller which transmits a control signal including a first channel signal and a second channel signal; and
    a first nonvolatile memory package which receives the first channel signal, and a second nonvolatile memory package which receives the second channel signal,
    wherein the first nonvolatile memory package and the second nonvolatile memory package are located on a single substrate, and the first channel signal and the second channel signal are diverged from the control signal in the substrate,
    wherein the substrate includes a first rewiring pattern comprising a first layer and a second layer located at different heights from each other and a second rewiring pattern comprising a third layer and a fourth layer located at different heights from each other, and
    from a planar perspective, the first and second rewiring patterns are spaced apart from each other in a direction parallel to the upper surface of the substrate.

12. The semiconductor package of claim 11, wherein a transmission length of the first channel signal is the same as a transmission length of the second channel signal.

13. The semiconductor package of claim 11, further comprising:
    a diverging chip, wherein the diverging chip receives the control signal and diverges the received control signal into the first channel signal and the second channel signal.

14. The semiconductor package of claim 13, wherein the diverging chip is located on an upper part of the substrate.

15. The semiconductor package of claim 13, wherein the diverging chip is located inside the substrate.

16. The semiconductor package of claim 11, wherein the first channel signal is transmitted to the first nonvolatile memory package through a first horizontal path and a first vertical path, the second channel signal is transmitted to the second nonvolatile memory package through a second horizontal path and a second vertical path, the first vertical path and the second vertical path extend in a first direction, the first horizontal path and the second horizontal path extend in a second direction perpendicular to the first direction, and the first horizontal path is lower than the second horizontal path in the first direction.

17. The semiconductor package of claim 16, wherein the control signal is transmitted through a third vertical path extending in the first direction before being diverged.

18. The semiconductor package of claim 11, wherein the first channel signal and the second channel signal are transmitted through both the first layer and the second layer, and a transmission length of the first channel signal transmitted through the first layer is different from a transmission length of the second channel signal transmitted through the first layer.

19. The semiconductor package of claim 11, further comprising:
   a first buffer chip and a second buffer chip located on an upper part of the substrate, and
   wherein the first rewiring pattern diverges an external electrical signal at a first diverging point and transmits it to the first and second buffer chips and the second rewiring pattern diverges an external electrical signal at a second diverging point and transmits it to the first and second buffer chips,
   from a planar perspective, the first and second diverging points are spaced apart from each other in the direction parallel to the upper surface of the substrate.

20. A semiconductor package comprising:
   a substrate;
   a first buffer pad and a second buffer pad located on an upper part of the substrate;
   a first buffer chip and a second buffer chip electrically connected to each of the first buffer pad and the second buffer pad;
   a plurality of nonvolatile memory chips located on the upper part of the substrate and including a first nonvolatile memory chip and a second nonvolatile memory chip, the first nonvolatile memory chip being electrically connected to the first buffer chip, and the second nonvolatile memory chip being electrically connected to the second buffer chip;
   a plurality of external connection terminals connected to a lower part of the substrate;
   a controller which transmits a control signal including a first channel signal and a second channel signal to one of the plurality of external connections terminals;
   a rewiring pattern which is located inside the substrate and electrically connected to one external connection terminal among the external connection terminal, diverges the control signal received from the one external connection terminal into the first and second channel signals, transmits the first channel signal to the first buffer chip, and transmits the second channel signal to the second buffer chip; and
   a diverging chip electrically connected to the rewiring pattern inside the substrate,
   wherein the diverging chip receives the control signal, diverges the received control signal into the first channel signal and the second channel signal, and transmits the received signal to the rewiring pattern,
   wherein the rewiring pattern comprises a first rewiring pattern and a second rewiring pattern between the first buffer chip and the second buffer chip,
   wherein the first rewiring pattern diverges an external electric signal at a first diverging point and transmits it to the first and second buffer chips and the second rewiring pattern diverges an external electric signal at a second diverging point and transmits it to the first and second buffer chips,
   from a planar perspective, the first and second diverging points are spaced apart from each other in a first direction parallel to the upper surface of the substrate, and
   from a planar perspective, the first and second rewiring patterns are spaced apart from each other in the first direction.

* * * * *